United States Patent
Arora et al.

(10) Patent No.: US 11,885,750 B2
(45) Date of Patent: Jan. 30, 2024

(54) INTEGRATED WAFER BOW MEASUREMENTS

(71) Applicant: Lam Research Corporation, Fremont, CA (US)

(72) Inventors: Rajan Arora, Hillsboro, OR (US); Michael Souza, Campbell, CA (US); Wayne Tang, Union City, CA (US); Yassine Kabouzi, Fremont, CA (US); Ye Feng, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 273 days.

(21) Appl. No.: 17/424,491

(22) PCT Filed: Jan. 24, 2020

(86) PCT No.: PCT/US2020/015114
§ 371 (c)(1),
(2) Date: Jul. 20, 2021

(87) PCT Pub. No.: WO2020/154708
PCT Pub. Date: Jul. 30, 2020

(65) Prior Publication Data
US 2022/0074869 A1    Mar. 10, 2022

Related U.S. Application Data

(60) Provisional application No. 62/796,963, filed on Jan. 25, 2019.

(51) Int. Cl.
*G01N 21/95* (2006.01)
*G01B 11/06* (2006.01)
(Continued)

(52) U.S. Cl.
CPC ......... *G01N 21/9505* (2013.01); *G01B 11/06* (2013.01); *H01L 21/681* (2013.01); *H01L 22/12* (2013.01)

(58) Field of Classification Search
CPC .. G01N 21/9505; G01B 11/06; H01L 21/681; H01L 22/12
(Continued)

(56) References Cited

U.S. PATENT DOCUMENTS

| 8,060,330 B2 | 11/2011 | Oneill et al. |
| 2007/0196011 A1 | 8/2007 | Cox et al. |

(Continued)

FOREIGN PATENT DOCUMENTS

| CN | 113330543 | 8/2021 |
| KR | 20040037279 A | 5/2004 |

OTHER PUBLICATIONS

International Application Serial No. PCT/US2020/015114, International Search Report dated May 27, 2020, 4 pgs.
(Continued)

*Primary Examiner* — Michael A Lyons
*Assistant Examiner* — Omar H Nixon
(74) *Attorney, Agent, or Firm* — Schwegman Lundberg & Woessner, P.A.

(57) ABSTRACT

In some examples, a wafer bow measurement system comprises a measurement unit including: a wafer support assembly to impart rotational movement to a measured wafer supported in the measurement unit; an optical sensor; a calibration standard to calibrate the optical sensor; a linear stage actuator to impart linear direction of movement to the optical sensor; a wafer centering sensor to determine a centering of the measured wafer supported in the measure-
(Continued)

ment unit; and a wafer alignment sensor to determine an alignment of the measured wafer supported in the measurement unit.

14 Claims, 14 Drawing Sheets

(51) Int. Cl.
*H01L 21/68* (2006.01)
*H01L 21/66* (2006.01)

(58) Field of Classification Search
USPC ..................................................... 356/237.5
See application file for complete search history.

(56) References Cited

U.S. PATENT DOCUMENTS

| | | | |
|---|---|---|---|
| 2008/0254553 A1* | 10/2008 | Yoo | ........................ H01L 22/14 438/10 |
| 2009/0088887 A1 | 4/2009 | Chen et al. | |
| 2012/0283865 A1 | 11/2012 | Bailey, III | |

OTHER PUBLICATIONS

International Application Serial No. PCT/US2020/015114, Written Opinion dated May 27, 2020, 4 pgs.
"International Application Serial No. PCT US2020 015114, International Preliminary Report on Patentability dated Aug. 5, 2021", 6 pages.

* cited by examiner ial Application No. PCT/

INTEGRATED WAFER BOW MEASUREMENTS

CLAIM OF PRIORITY

This application is a U.S. National Stage Filing under 35 U.S.C. 371 from International Application No. PCT/US2020/015114, filed on Jan. 24, 2020, and published as WO 2020/154708 A1 on Jul. 30, 2020, which claims the benefit of priority to U.S. Patent Application No. 62/796,963, to Arora et al, entitled "Integrated Wafer Bow Measurements" filed on Jan. 25, 2019, each of which is incorporated by reference herein in its entirety.

FIELD

The subject matter disclosed herein relates to equipment used in the semiconductor and related industries. More specifically, the present disclosure relates to integrated wafer bow measurements, and in one example to wafer bow measurement using an optical sensor.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Advances in plasma processing have facilitated growth in the semiconductor industry. Usually, a plurality of semiconductor devices may be created from dies cut from a single processed wafer (i.e., substrate). Since most recipes for processing the wafer assume that the wafer is planar, a non-planar wafer (e.g., a wafer with a bow) may cause variations that may result in defective semiconductor devices being created.

A degree of wafer bow is usually indicative of a degree of wafer stress, High bow wafers may cause chucking failures at lithography. In an ideal situation, a wafer is perfectly planar. However, most wafers tend to have a slight bow and/or bump, thereby causing the wafer to be non-planar. The non-planarity of the wafer may be due to the original shape of the wafer and/or may be a result of the stress (e.g., mechanical stress) to the film that may have been deposited onto the wafer during one or more deposition steps. In some instances, if the wafer is too non-planar, the wafer may be considered unusable and may be discarded.

During certain processing steps, such as etching or deposition, knowing the configuration of the wafer may be important to accurately determine the amount of etching and to prevent the electrode within the processing chamber from accidentally touching the wafer, thereby causing damage to the wafer and/or damage to the electrode. This is especially true for processing chamber that may be sensitive to wafer bow. In an example, a bevel etcher may be especially sensitive to wafer bow since the upper electrode may come within very close proximity to the Wafer in order to etch along the edge (e.g., bevel) of the wafer.

In a bevel etcher, the gap between an upper electrode and a wafer may be about 0.35 millimeters. However, the wafer bow may be as big as 0.25 millimeters. Thus, if the wafer bow is not correctly identified, the upper electrode may accidentally touch the wafer, thereby causing damages to the wafer and/or the upper electrode. In addition, since the amount of plasma that may be introduced into the process module may also depend on knowing the actual gap, not being able to accurately identify the gap may cause variation in the processing.

Hence, before etching may be performed on the wafer, measurements may have to be performed to determine the extent of the wafer bow. However, in-line measurements are generally not taken during the deposition process. Thus, measurement data may not be available to be fed into the etching process in order to determine the extent of the wafer bow. Instead, stand-alone metrology, tools may be employed in order to determine the measurement of a wafer bow. However, the stand-alone metrology tools are usually employed for performing characterization measurement. In other words, each wafer is not measured to determine the wafer bow for the wafer. Instead, a sample may be taken to determine the type of wafer bow that may characterize a cluster of wafers. In addition, since the stand-alone metrology tools are not in-situ or even in-line, the measurements data are usually not in a format that enables the data to be easily fed forward to another tool, such as a bevel etcher.

A method that has been employed to enable in-situ measurements is to include a metrology tool within a process module in order to measure the wafer bow. In an example, measurements of the wafer bow may be taken while the wafer is sitting on an electrostatic chuck within a processing module, while waiting for the etching process to begin. One method of performing this measurement includes shining a beam of light across the wafer and measuring the level of light brightness as the upper electrode of the processing module is lowered to reduce the gap between the upper electrode and the wafer. The lowering of the upper electrode is stopped when a predetermined amount of light is no longer detected. At this point, the upper electrode is determined to be within close proximity to the wafer but not yet touching the wafer.

The purpose of identifying the point at which the upper electrode may be closed to touching the wafer is to determine the minimal distance between the electrode and the wafer, thereby identifying the height of the wafer. Unfortunately, the measurements that are taken are local to a single point. Thus, the measurements may not be the actual height of the water.

Current standalone technology is either limited by TpT (wafers measured point by point) or have a measurement range of <300 micron making them unsuitable for process control. Moreover, standalone systems are not designed to measure hot wafers and are therefore not suited to making real-time measurements. Wafer bow compensation can in some instances be performed by depositing film on the back side of a bowed wafer using a deposition tool, for example, but this does not provide adequate bow compensation in high volume manufacturing in real-time.

SUMMARY

In some examples, an optical sensor, such as a laser triangulation-based distance sensor, is integrated on to the front end of a substrate (e.g. a wafer) processing tool, such as a deposition tool. Using a combination of linear and rotational stages, the optical sensor scans a wafer surface in a desired fashion and a wafer bow is measured. Real-time wafer bow measurements from the integrated optical sensor are used to establish process monitoring and control on the deposition tool.

In some examples, a wafer bow measurement system comprises a measurement unit including: a wafer support assembly to impart rotational movement to a measured wafer supported in the measurement unit; an optical sensor; a calibration standard to calibrate the optical sensor; a linear stage actuator to impart linear direction of movement to the optical sensor; a wafer centering sensor to determine a centering of the measured wafer supported in the measurement unit; and a wafer alignment sensor to determine an alignment of the measured wafer supported in the measurement unit.

In some examples, the wafer centering sensor includes an actuator for active centering of the measured wafer supported in the measurement unit.

In some examples, the wafer support assembly includes a wafer alignment chuck.

In some examples, the wafer bow measurement system further comprises a reference wafer unit.

In some examples, the reference wafer unit includes a plurality slots to accommodate a series of different reference wafers.

In some examples, the series of different reference wafers provide a range of measurement control references for the measured wafer supported in the measurement unit.

In some examples, the wafer bow measurement system further comprises a plurality of measurement units and at least one reference wafer unit.

In some examples, the wafer bow measurement system is integrated with a wafer processing tool.

In some examples, the calibration standard includes at least one premeasured feature or facet scannable by the optical sensor to detect a stray in wafer bow measurement over time.

In some examples, the scannable feature or facet includes a wedge shaped silver coated diffused optical flat to serve as a proxy for a wafer thickness.

In some examples, the calibration standard includes multiple steps scannable by the optical sensor to detect a stray in wafer bow measurement over time.

In some examples, the wafer bow measurement system further comprises a temperature sensor or a humidity sensor, and wherein a selection of a reference wafer in the series of different reference wafers is based on data derived from the temperature sensor or the humidity sensor.

In some examples, the wafer bow measurement system further comprises a vibration isolation mechanism or mount.

Some examples include a method of measuring a wafer bow of a wafer in a wafer processing stream that includes a wafer processing module, the method comprising: integrating a wafer bow measurement system with the wafer processing module; extracting a wafer from the wafer processing stream for wafer bow measurement by the wafer bow measurement system; adjusting a parameter of the water processing stream based on a wafer bow measurement derived by the wafer bow measurement system; and placing the measured wafer back into the wafer processing stream.

In some examples, the wafer bow measurement system used in an example method comprises: a measurement unit including; a wafer support assembly to impart rotational movement to a measured wafer supported in the measurement unit; an optical sensor; a calibration standard to calibrate the optical sensor; a linear stage actuator to impart linear direction of movement to the optical sensor; a wafer centering sensor to determine a centering of the measured wafer supported in the measurement unit; and a wafer alignment sensor to determine an alignment of the measured wafer supported in the measurement unit.

Further areas of applicability of the present disclosure will become apparent from the detailed description, the claims, and the drawings. The detailed description and specific examples are intended for purposes of illustration only and are not intended to limit the scope of the disclosure.

DESCRIPTION OF THE DRAWINGS

Some embodiments are illustrated by way of example and not limitation in the views of the accompanying drawings.

DESCRIPTION

Figure 1:
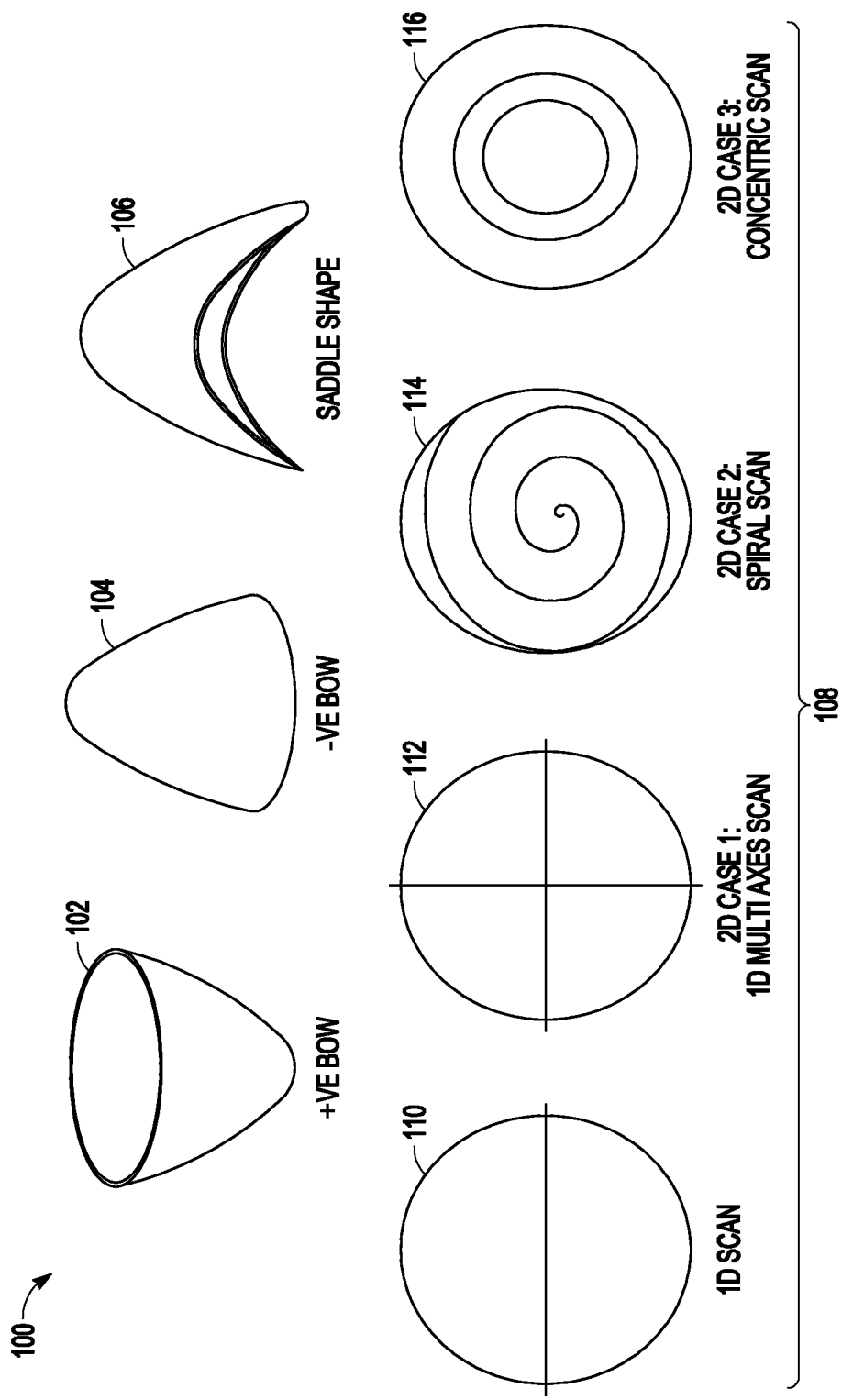
FIG. 1 shows a schematic array of different types of wafer bow, according to example embodiments.

The description that follows includes systems, methods, techniques, instruction sequences, and computing machine program products that embody illustrative embodiments of the present invention. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2018, All Rights Reserved.

By way of general background, semiconductors usually start as a wafer-thin slice of a purified semiconductor material. Usually these wafers are produced by heating the material, molding it, and processing it to cut and grind it into small, smooth wafers.

In a deposition phase, the prepared wafers are cleaned, heated and exposed to pure oxygen within a diffusion furnace. This results in a reaction that produces a uniform film of silicon dioxide on the surface of the wafer.

In a masking phase (also called photolithography or photo-masking), this process protects one area of the wafer while another is worked on. After applying a light-sensitive film to one part of the wafer, an intense light is then projected through a mask onto it, exposing the film with the mask pattern.

In an etching phase, manufacturers bake the wafer to harden the remaining film pattern, and then expose it to a chemical solution to eat away the areas not covered by the hardened film. After this step, the film is removed, and the wafer is inspected to ensure proper image transfer. Doping, deposition, and plating phases may follow in the semiconductor manufacturing process.

In some examples, a wafer bow measurement system includes an optical distance sensor (for example, a laser triangulation sensor having a large measurement range in the region ±2000 µm) integrated with a wafer aligner and mounted on the front end of a wafer deposition tool. Other integration arrangements are possible. Using a combination of linear and rotational stages, the sensor measures relative distances with respect to a wafer surface and a wafer shape or bow is calculated or derived. The total measurement time may take less than 2 seconds in some examples allowing for real-time applicability. Real-time wafer bow measurements from the integrated wafer bow measurement system can be used to establish process monitoring and control on a wafer deposition or bow compensation tool. In some examples, the approach may be applied to other wafer processing tools, such as etching, strip and clean, and metrology modules.

An example wafer bow measurement system may include a measurement unit comprising the following elements: an optical distance sensor which measures relative distance to the wafer, linear and rotational motion axes (or paths of sensor travel) to scan a wafer in a desired manner, a set of sensors to monitor a wafer and its environment state (for example, wafer temperature, an ambient temperature, an ambient humidity sensor, an accelerometer, a sensor temperature measurement, or a wafer fiducial (notch) alignment sensor). Other environment sensors or measurements are possible. An environment compensation factor may be applied based on measurements taken the environment sensors.

An example wafer bow measurement system may also include a reference wafer unit that accommodates different reference wafers. A specific reference wafer measurement may be subtracted from (or factored into) a raw wafer measurement. In some examples, the reference wafer measurements may allow for the compensation or reduction of mechanical component noise and the effects of gravity related wafer sag or wafer aligner fingerprint. The wafer bow measurement system may also include an integrated calibration standard to check sensor accuracy and status. In some examples, the calibration standard is mounted next to a wafer in the measurement unit and can be measured for calibration purposes during a wafer scan or at periodic intervals. In some examples, a wafer bow measurement system includes a controller which can communicate with the environment and optical sensors and calculate or derive a wafer bow.

In an example process flow, wafers are transferred pre and/or post processing to a bow metrology station of a measurement unit for both notch alignment and water bow measurement. The measurement can be used to establish process monitoring and control in a wafer deposition tool. Some process examples may be "feedforward" based in which pre-processed wafer bow values are feed forward to a process module of the deposition tool to control incoming wafer bow variation. Other process examples are "feedback" based in which pre-processed and post measurement data can be used for the following operations: process module quality assessment, wafer excursion detection (or non-compliance with specification), compensation for process module drift over time, chamber accumulation, and other operations. In the event a target how value is not achieved, wafers can be rerouted back to the process module to achieve a desired bow compensation.

In some examples, instead of using an optical triangulation sensor, a confocal, or a chromatic confocal, or an interference-based sensor, or a confocal interference-based sensor, or an inductance sensor, or a capacitive sensor may be used for taking wafer bow measurements. A combination of multiple sensors may also be used.

With reference to FIG. 1, an array 100 of different types of wafer bow are depicted. Element 102 depicts a positive bow type, element 104 depicts a negative bow type, and element 106 depicts a saddle shape. Different measurement schemes 108, comprising combinations of linear and rotational movement, may be employed to measure the bow types depicted in array 100. An optical sensor in a measurement unit discussed further below may adopt one of more of the measurement schemes 108 to measure or derive a wafer bow. Measurement scheme 110 may include a 1-dimensional (1-D) wafer scan. Measurement scheme 112 may include a 2-dimensional (2-D) wafer scan comprising for example a 1-D scan taken by the optical sensor along multiple linear axes. For example, a single linear scan may be followed by a 90° rotational movement of the scanned wafer, followed by a second linear scan. Measurement scheme 114 may include a 2-D spiral scan, for example comprising continuous rotational movement of a wafer by a measurement unit, coupled with linear movement of the optical sensor. Measurement scheme 116 may include a 2-D concentric wafer scan, for example comprising rotational movement of a scanned wafer coupled with spaced or intermittent linear movement of an optical sensor to create the illustrated concentric rings of wafer bow measurement.

An example method for providing metrology for substrate processing, such as bow types of wafer bow measurement, includes providing an optical metrology station including a plurality of optical sensors to measure spectra from a plurality of measurement locations on a substrate, measuring at least one of a mass or mass change of the substrate, generating thickness values at the plurality of measurement locations of the substrate based on the spectra from the plurality of measurement locations and a learned model, and generating a spatial thickness distribution model for the substrate based on the thickness values at the plurality of measurement locations and the at least one of the mass or the mass change. In this regard, reference is made to commonly owned U.S. patent application Ser. No. 15/696,768 entitled "Systems and Methods for Combining Optical Metrology with Mass Metrology" which is hereby incorporated in its entirety.

Figure 2:
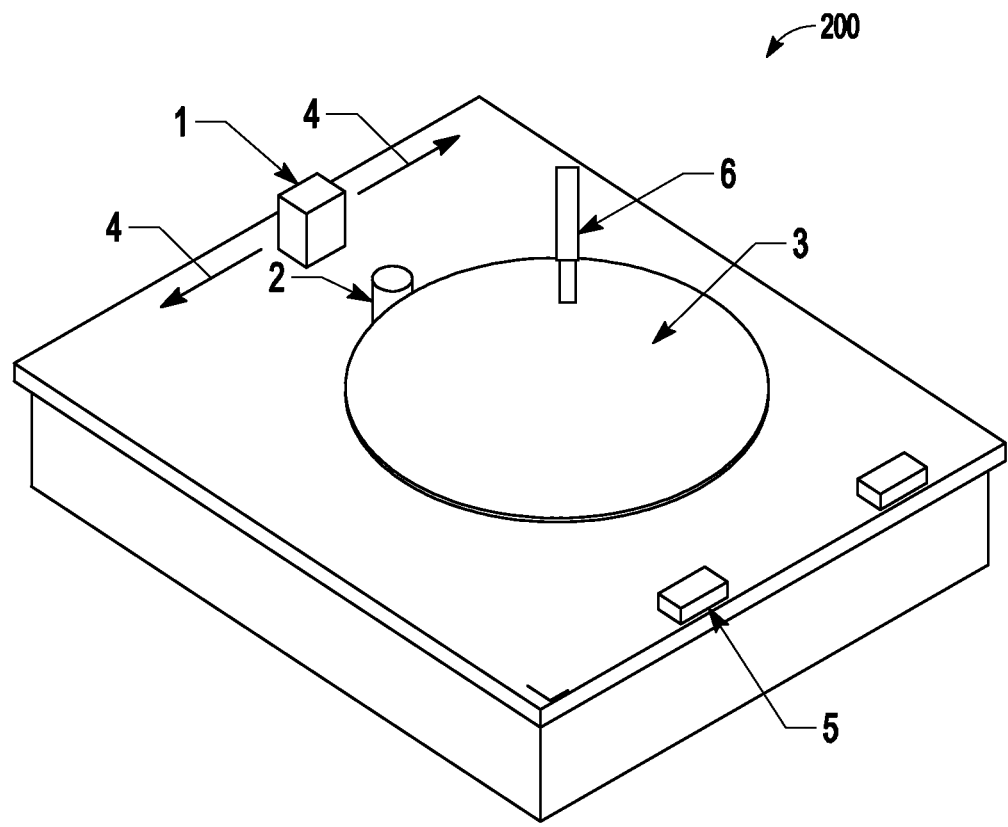
FIGS. 2-3 show respectively pictorial and side views of an example measurement unit for a wafer bow measurement system, according to an example embodiment.
Figure 3:
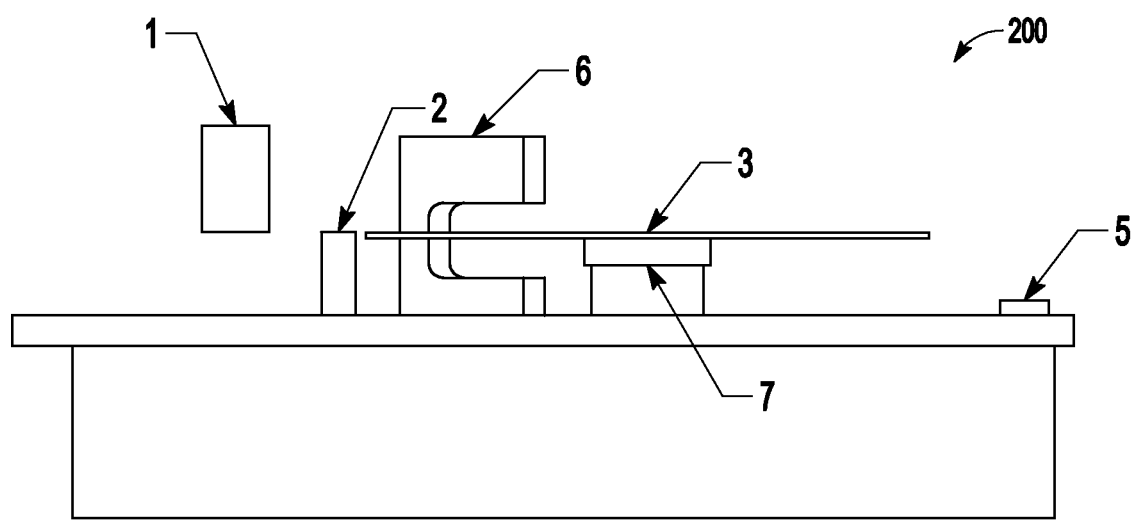

FIGS. 2-3 depict respectively pictorial and side views of an example measurement unit 200 for a wafer bow measurement system. The measurement unit 200 includes a housing or platform that accommodates or supports an optical sensor 1, a calibration standard 2, a wafer 3 (for wafer bow measurement), a linear stage actuator to impart linear direction of movement 4 to the optical sensor 1, a wafer centering sensor such as an Active-Wafer-Centering (AWC) sensor 5 that includes an actuator for active wafer centering, a wafer alignment sensor 6, and a wafer support assembly such as rotation stage (aligner) chuck 7 (FIG. 3). A linear stage may impart linear movement 4 to the optical sensor 1, and the rotation stage 7 may impart rotational movement to the measured wafer 3 so as to adopt one or more of the measurement schemes 108 depicted in FIG. 1 to derive a wafer bow measurement of the wafer 3.

Figure 4:
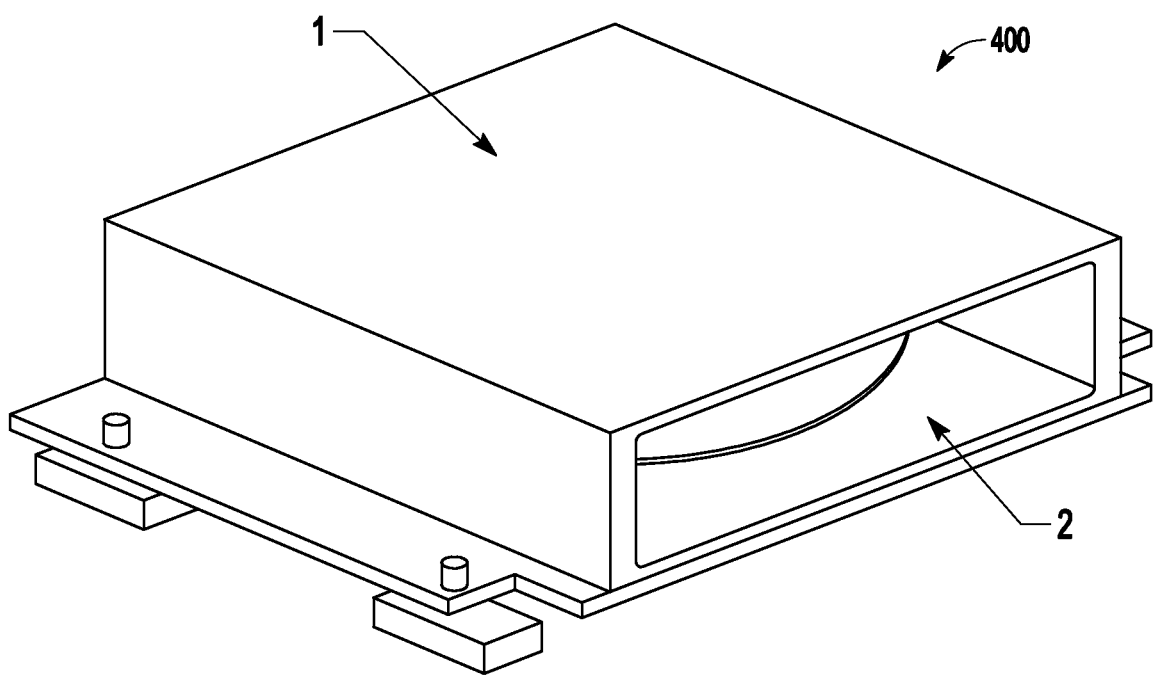
FIG. 4 shows a pictorial view of a reference wafer unit, according to an example embodiment.

FIG. 4 depicts a pictorial view of a reference wafer unit 400, described further below. The reference wafer unit 400 may include a number of slots (not shown) to accommodate a series of different reference wafers, for example of different wafer thicknesses, wafer bow, stress, rigidity/flexibility, and crystal orientation to provide a range of measurement control references for the different types of wafer 3 being measured.

Figure 5:
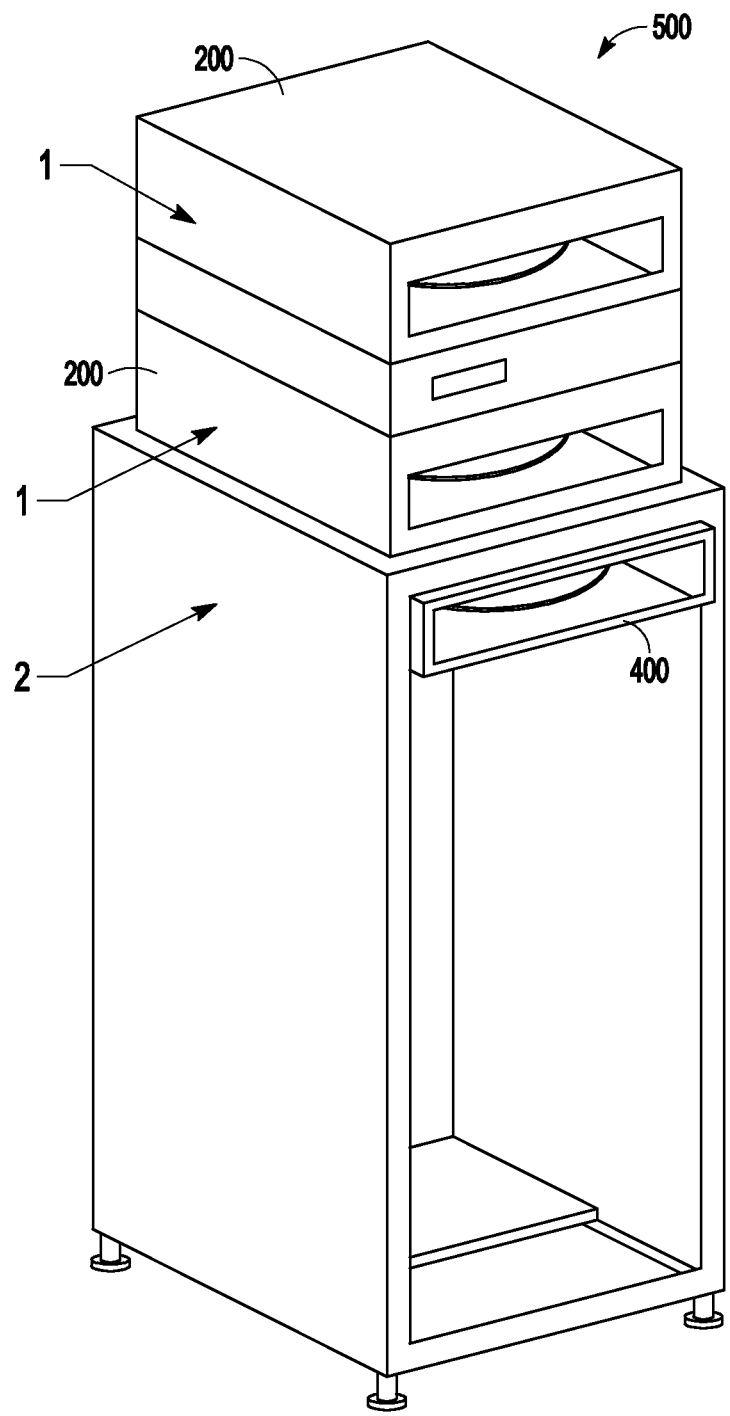
FIG. 5 shows a pictorial view of components of a wafer bow measurement system, according to an example embodiment.
Figure 6:
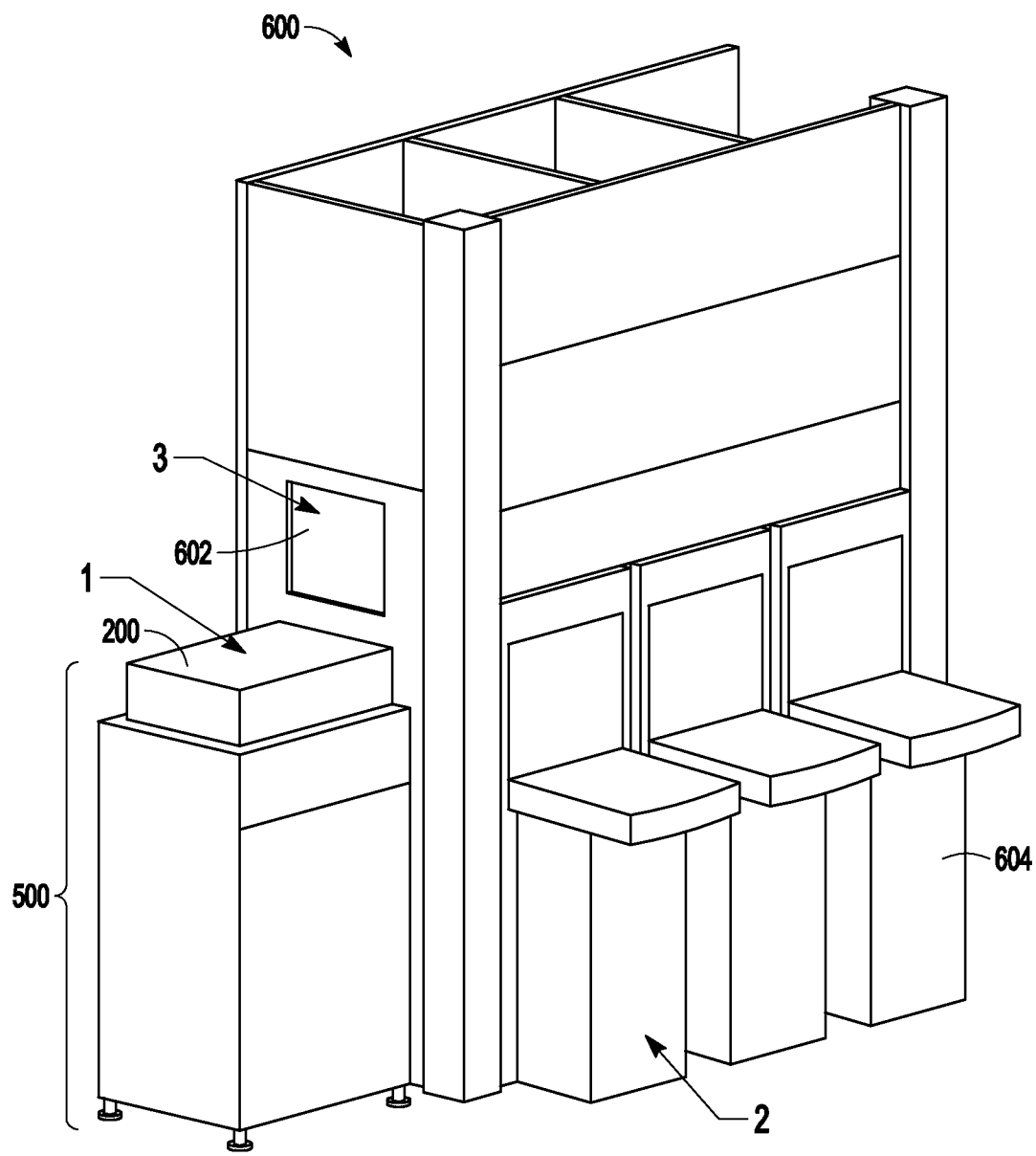
FIG. 6 shows an example wafer bow measurement system, according to an example embodiment.
Figure 7:
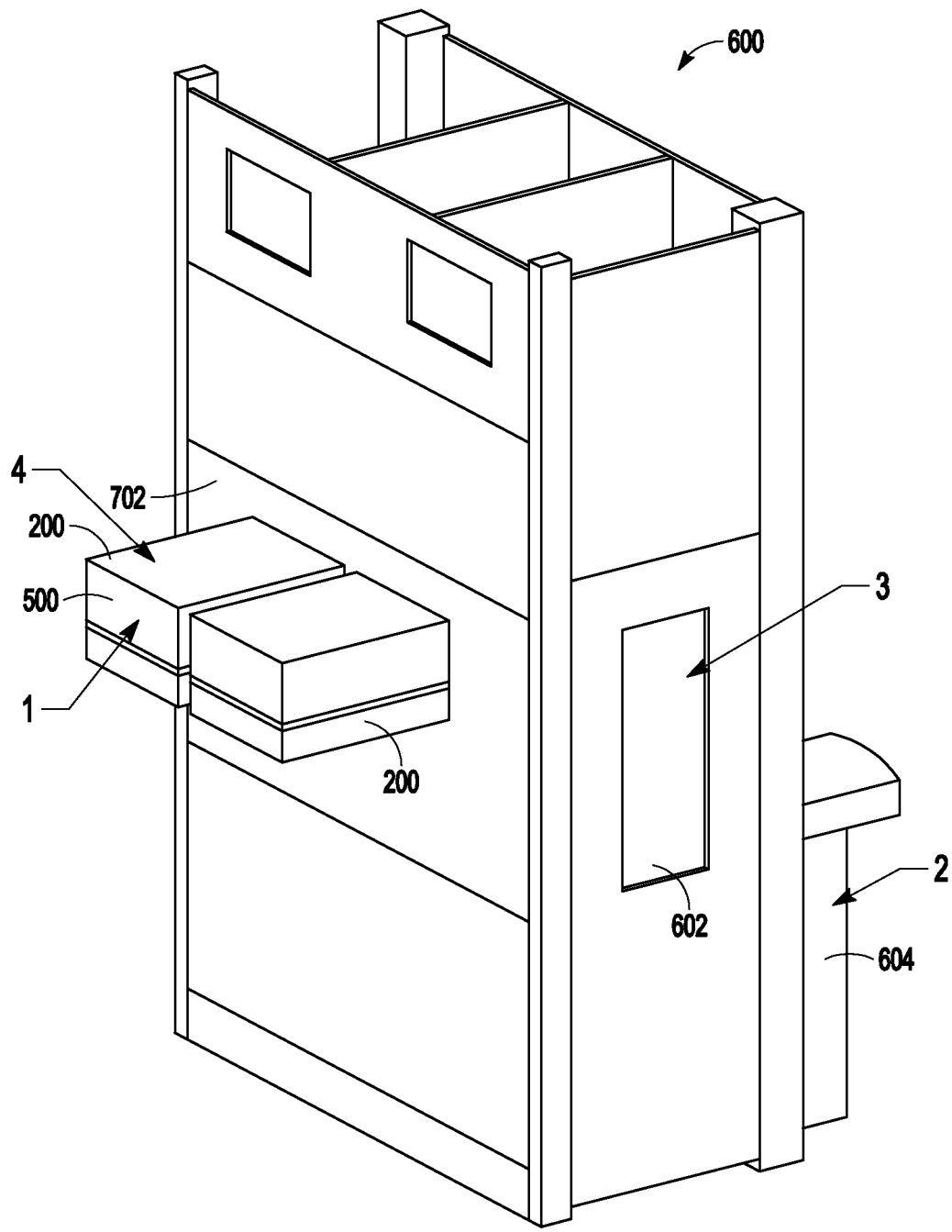
FIG. 7 shows a pair of measurement units, according to example embodiments.
Figure 8:
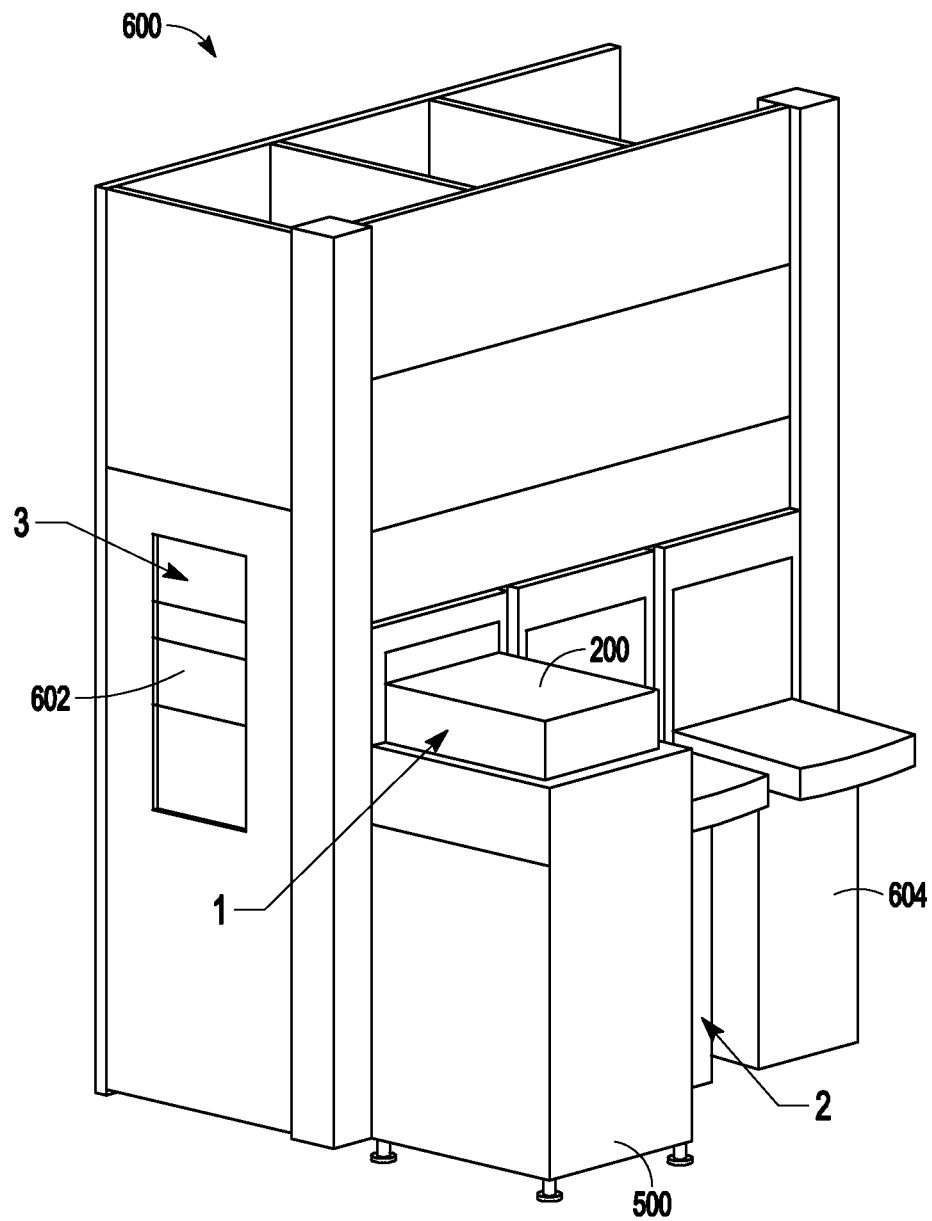
FIG. 8 shows a measurement system according to an example embodiment.

FIG. 5 depicts a pictorial view of components of a wafer bow measurement system 500. In this example, the system 500 includes two stacked measurement units 200 and a reference wafer unit 400. With reference to FIGS. 6-8, in some example embodiments a wafer bow measurement system 500 may be integrated with, or mounted to, a deposition tool or module 600. In FIG. 6, an example wafer bow measurement system 500 is shown mounted adjacent a side port 602 of an example deposition module 600. The measurement system 500 may include one or more measurement units 200 and, where desired, further comprise reference wafer units 400. A series of one or more pod loaders 604 may be utilized to introduce wafers into the interior of the deposition module 600 where the wafers may be accessed (or pre-measured) for wafer bow measurement by a bow measurement unit 200.

Other mounting locations for a measurement system 500 or measurement units 200 are possible. For example, in FIG. 7, a pair of measurement units 200 is shown mounted at a designated Integrated Metrology Module (IMM) port 702 of a deposition module 600. In FIG. 8, a measurement system 500 is mounted at a pod loader location.

Figure 9:
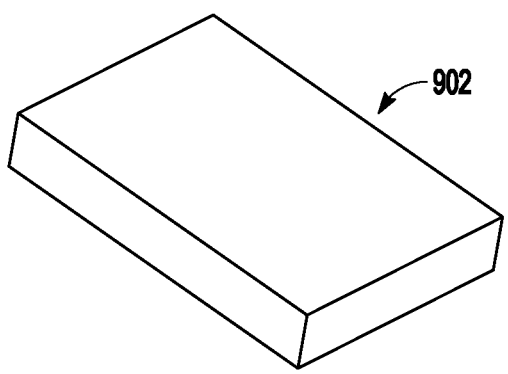
FIGS. 9-10 show schematic pictorial and sectional views of a calibration standard, according to an example embodiment.
Figure 10:
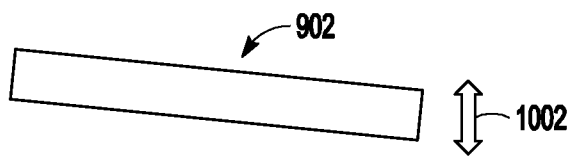

Reference is made back to FIG. 2 and the provision of a calibration standard 2 in some example measurement units and systems. Schematic pictorial and sectional views of an example calibration standard 902 are shown in FIGS. 9-10, respectively. The illustrated calibration standard 902 has pre-measured features and facets that may be scanned by an optical sensor (for example the optical sensor 1 in FIG. 2) to check that measurements taken by the optical sensor 1 are correct and accurate and have not strayed over time. Here, the calibration standard 902 includes a wedge-shaped silver-coated diffused optical flat that may be positioned closely adjacent a wafer (e.g. a wafer 3 in FIG. 2) in a measurement unit 200 in use. As visible more clearly in FIG. 10, the example optical flat 902 generally inclines downwardly from left to right in the view to a drop or depth 1002. Other configurations or inclinations of a calibration standard 2 or optical flat 902 are possible. In some examples, a pre-measured (or known) optical depth 1002 of the optical standard 2 or optical flat 902 can serve as a proxy for a wafer thickness or a vertical degree of wafer bow and be used to calibrate or check an optical sensor reporting such a value, accordingly. The calibration standard 2 or optical flat 902 may be scanned during a wafer scan operation or may be scanned at other times for example when a deposition module 600 or measurement unit 200 is available. The example calibration operations described above seek to assure that a measurement unit 200 is performing within a desired measurement specification.

Figure 18:
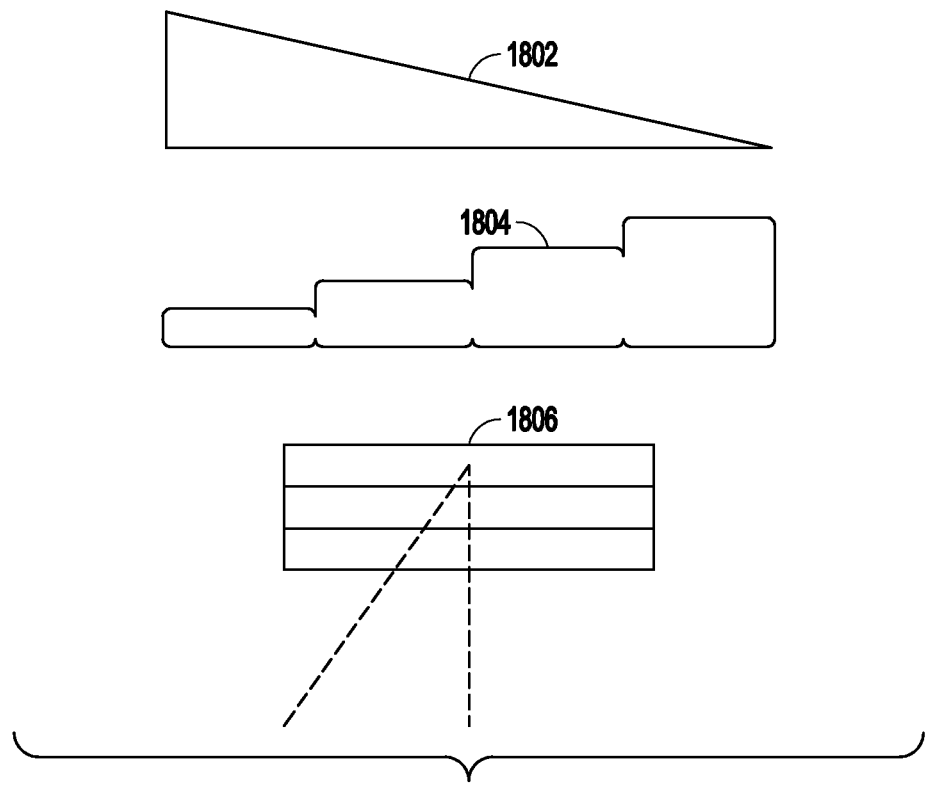
FIG. 18 shows schematic pictorial and sectional views of aspects of a multi-step and multi-interface calibration standards, according to example embodiments.

With reference to FIG. 18, in some examples a multi-step standard 1802 is provided. Instead of a wedge, a standard 1804 may include multiple flat steps, as shown. Another example standard 1806 includes multiple interfaces. In some examples of this nature, a standard can be made of optically transparent materials that include multiple interfaces. Light from a sensor is reflected at each interface and gets focused at different points on the detector and hence thickness of each interface can be measured in one operation. This can be used for sensor calibrations. Further, the interface may have anti-reflection coatings to avoid multiple re-reflection between interfaces.

In some instances, wafer bow measurements may be affected by noise or specific temporal environmental conditions. These factors may negatively affect the taking of accurate wafer bow measurements. Some examples herein seek to subtract or compensate for such noise or environmental conditions. For example, a wafer bow may depend at any given time on how the wafer is held on the aligner lift pins in an electrostatic chuck (ESC). A "reference" wafer measurement may be taken by a reference wafer unit (for example wafer reference unit 400 in FIG. 4) and subtracted from a "process" wafer measurement to derive a "clean" wafer bow result. A reference wafer will typically suffer from the same noise as a processed wafer, and so once the noise suffered by the reference wafer can be determined, its dimension or effect can be subtracted from a corresponding measurement taken from a processed wafer of the same type. In the present example, such a wafer reference operation may filter out or minimize two sources of potential measurement uncertainty, namely a deforming effect of the lift pins, and the effect of gravity causing a wafer to sag down in central regions unsupported by the pins. In further examples, systemic z-axis noise from moving mechanical components such as a linear stage 4, a rotational stage 7 may be eliminated in similar fashion. One or more reference wafers, each having specific properties to suit a corresponding processed wafer, may be stored in a reference wafer unit 400 in association with a measurement unit 200, as shown for example in FIG. 5.

Figure 11:
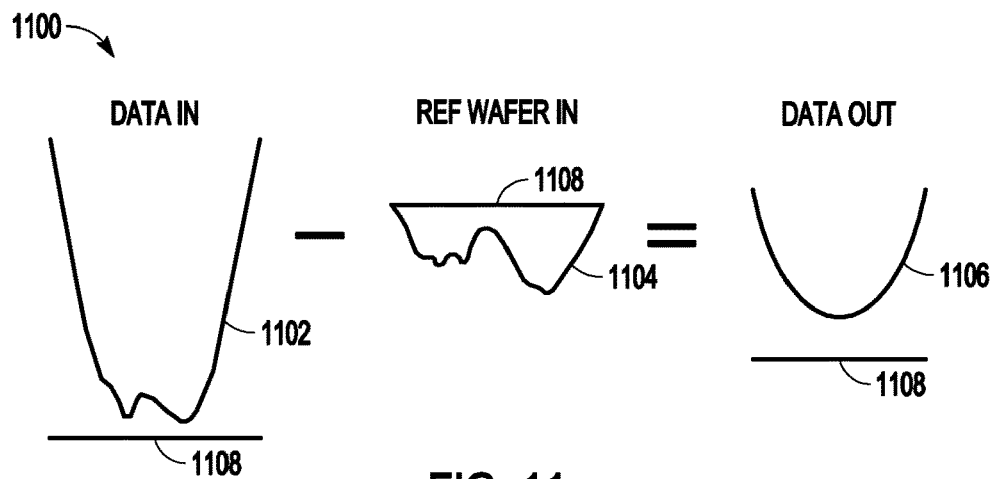
FIG. 11 shows a schematic diagram representing operations in a noise subtraction operation, according to an example embodiment.
Figure 12:
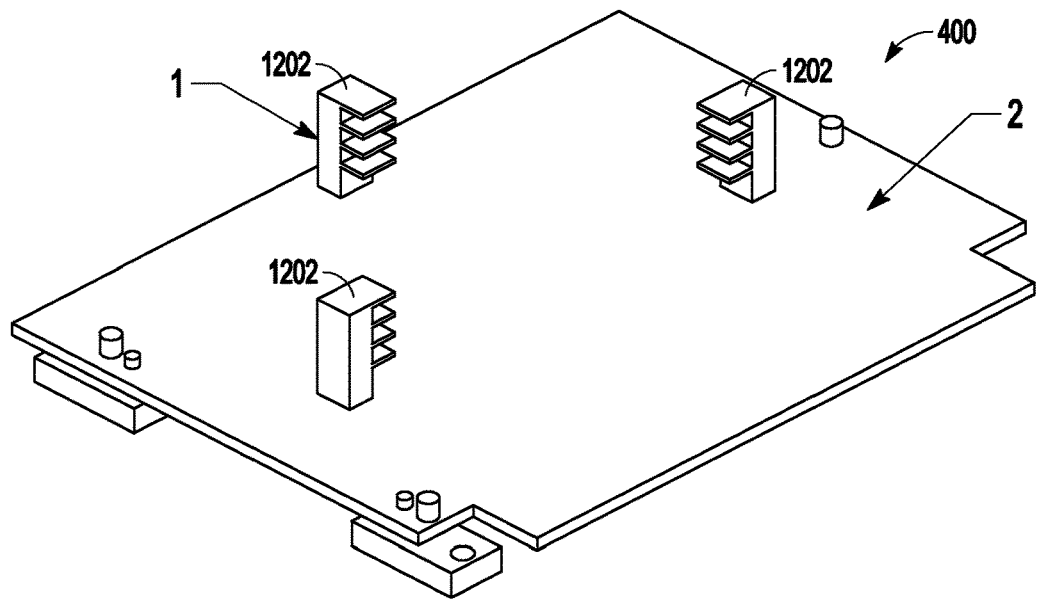
FIGS. 12-13 show schematic pictorial and sectional views of some internal components of a reference wafer unit, according to an example embodiment.
Figure 13:
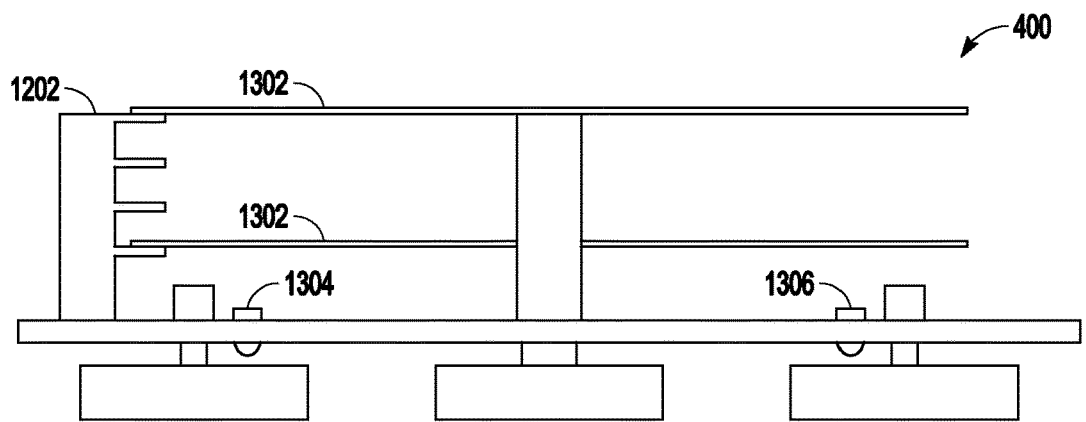

A schematic diagram representing operations in an example noise subtraction operation 1110 is shown in FIG. 11. The wafer bow measurement data for a process wafer may include noise or background factors, shown generally in the region 1102 of the data-in graph. The noise 1102 may for example be caused by one or more of the elements described above. At this point, the level of any noise, or even its existence, will likely not yet have been established. Measurements taken from a corresponding reference wafer, affected by the same noise as the process wafer, can be used to establish the existence of noise and derive the noise level. The existence of noise and its level is shown by the region 1104 of the middle reference wafer graph. The noise level may be subtracted from the data-in data to derive an accurate data-out graph, as shown. The data-out graph 1106 is more representative of a true wafer bow measurement. Schematic pictorial and sectional views depicting internal component of an example reference wafer unit 400 are shown in FIGS. 12-13. The reference wafer unit 400 may include reference wafer slots 1202 for supporting one or more reference wafers 1302. Temperature and humidity sensors 1304 and 1306 may be included in an example reference wafer unit 400. In some examples, the temperature and humidity sensors 1304 and 1306 may operate in conjunction with other sensors discussed further below. Noise created by temperature and humidity may also be factored out of, or compensated for, in some examples.

Figure 14:
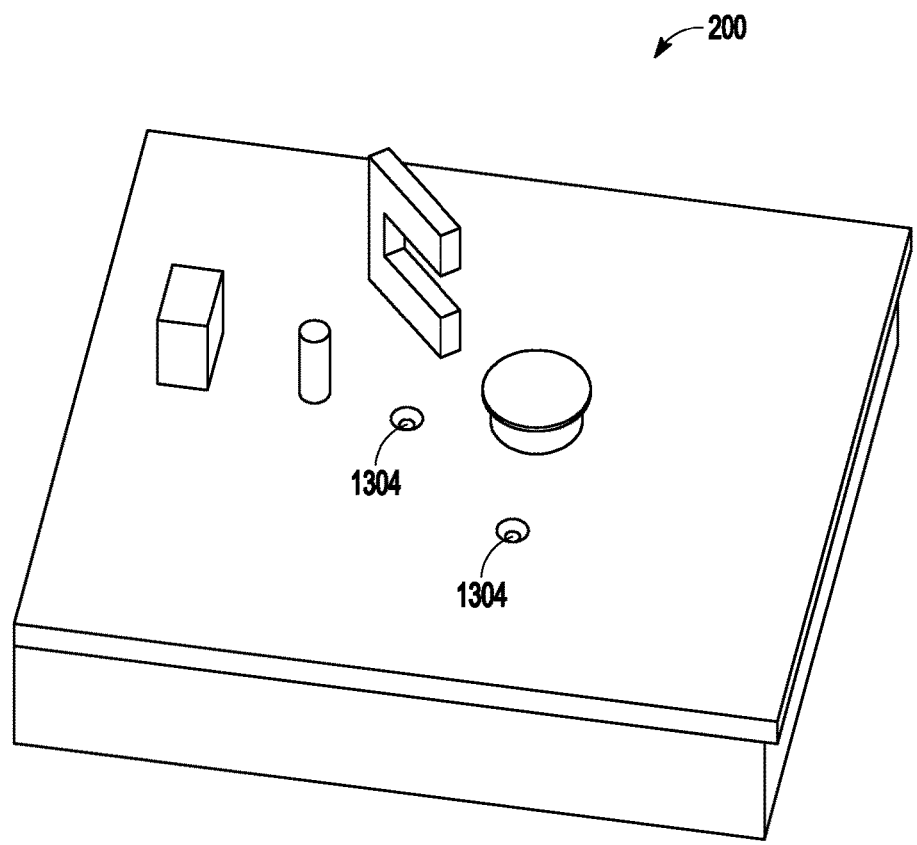
FIGS. 14-15 show pictorial views of a measurement unit, according to an example embodiment.
Figure 15:
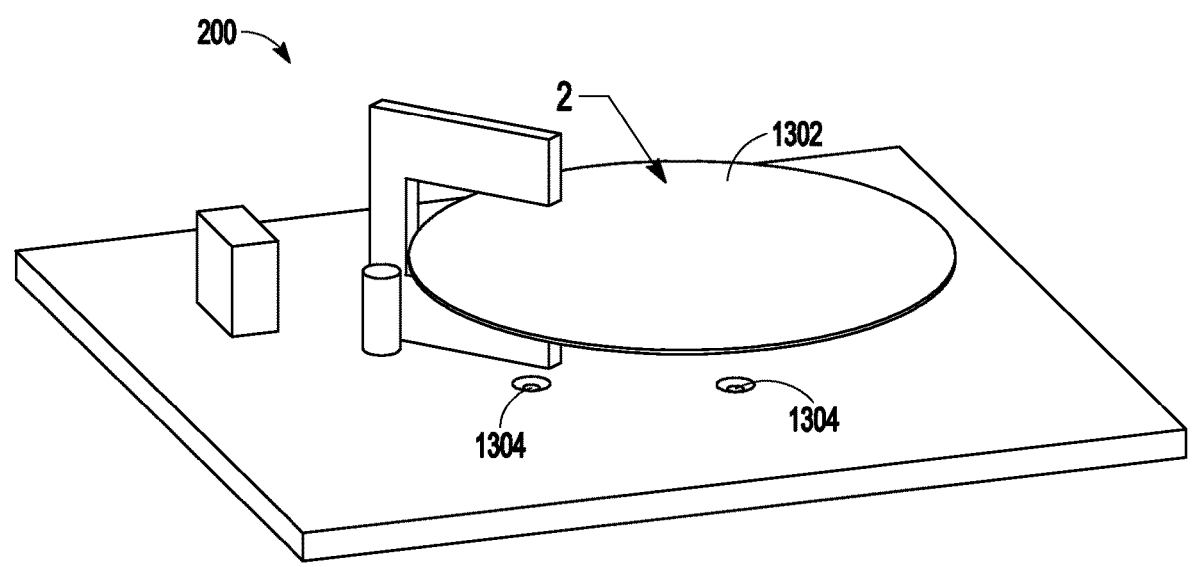
Figure 16:
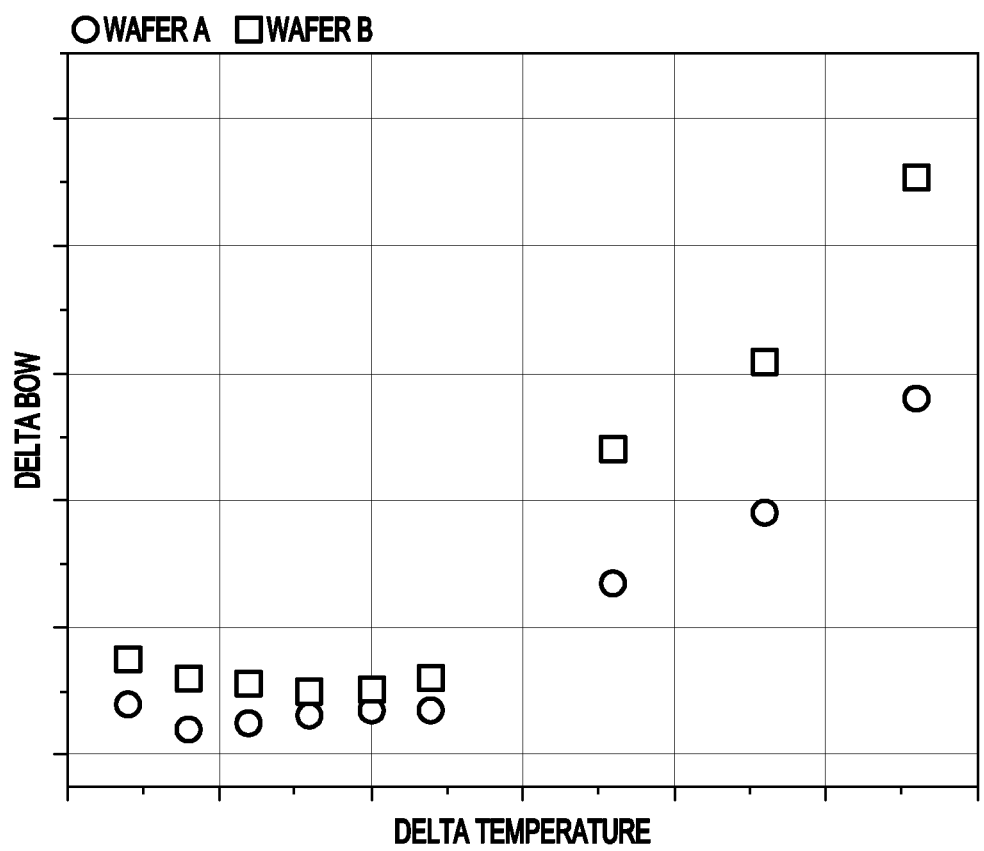
FIG. 16 shows example graphed results of a wafer bow measurement method, according to examples embodiments.

In some examples, the temperature of a wafer may change stresses in the wafer film and substrate and affect wafer bow. To this end, a series of non-contact optical sensors are placed in some examples below a wafer in a measurement unit 200 for wafer temperature measurement. Based on the wafer's temperature, as well as certain deposited film and substrate properties, temperature compensation may be applied to a bow measurement of the wafer. Pictorial views of a measurement unit 200 including example temperature sensors 1402 is shown in FIGS. 14-15. A reference or process wafer 1302 located above the sensors for bow measurement is shown in FIG. 15. Example bow measurements are shown in the graph 1600 of FIG. 16. Changes in a wafer bow (delta bow) are shown on the y-axis of the graph 1600 relative to a wafer's temperature depicted on the x-axis.

Thus, in some examples, ambient humidity and temperature compensation is provided. Ambient humidity and temperature sensors are added to a measurement unit 200 and reference wafer unit 400. This arrangement may be used to minimize measurement uncertainty or noise associated with these environment conditions. In further examples, sensor temperature compensation may be provided. For example, the temperature of an optical or distance sensor can affect its linearity, A temperature sensor may thus be mounted next to the sensor to assess a degree of linearity drift. This arrangement can be used to minimize measurement uncertainty associated with sensor temperature.

Some examples of measurement units 200 and/or reference wafer units 400 include vibration compensation. Any vibration in these components may affect wafer bow measurement uncertainty. Example vibration isolation mechanisms may include one or more of an isolation mount (for example, to minimize floor vibrations), an O-ring (for example, to isolate front end vibration), an accelerometer (for example, to flag measurements during large vibrations), and a seismic mount (for example, to minimize seismic vibrations).

Other examples may include specific wafer placement in a measurement unit 200 or reference wafer unit 400. For example, an eccentricity or incorrect wafer placement on a lift pin can affect bow measurement. An AWC mechanism may be added to a measurement unit 200 in order to address this error (or noise) source. An AWC may ensure that a measured process or reference wafer is concentric to the lift pins.

Figure 17:
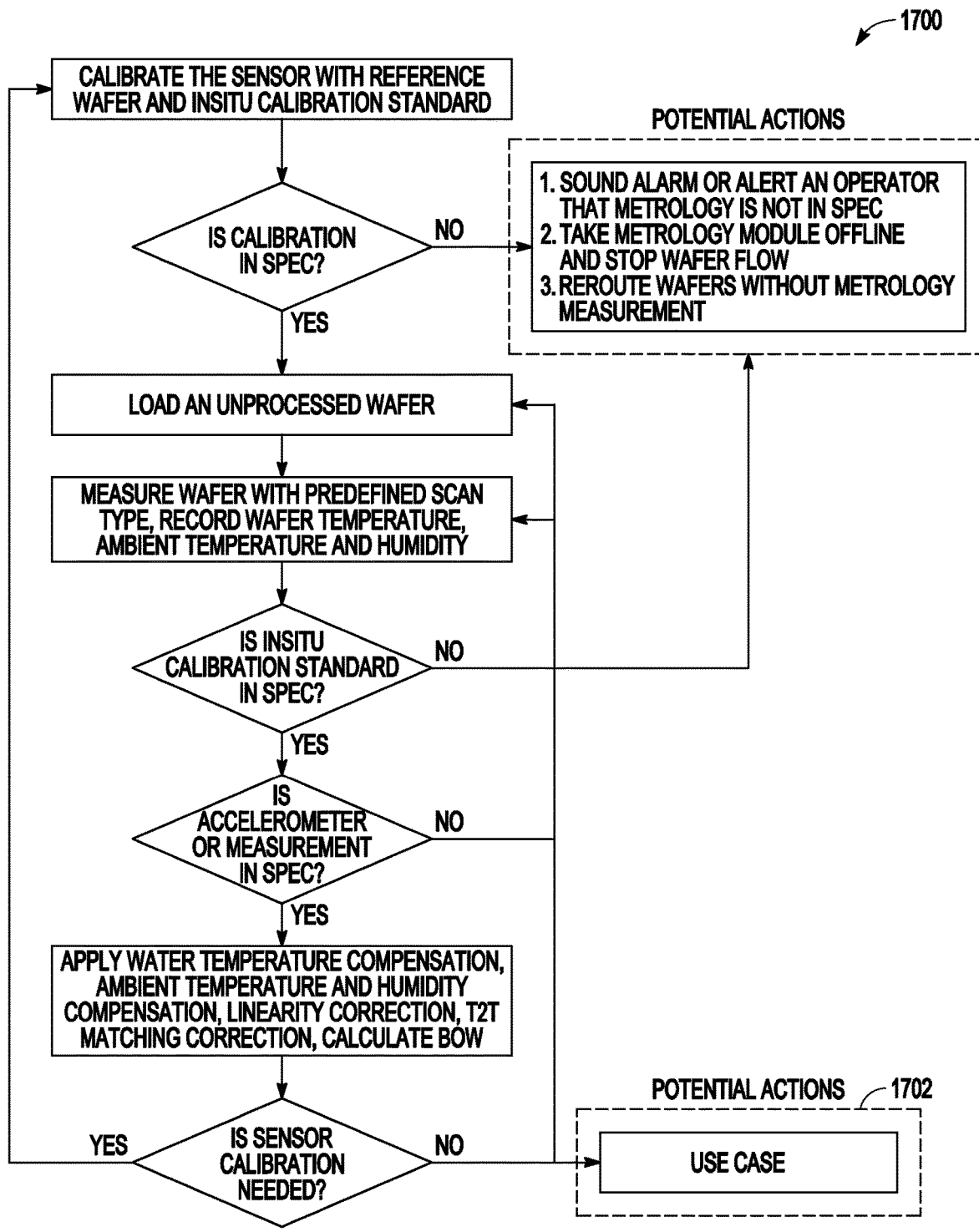
FIG. 17 shows operations in a wafer bow measurement method, according to example embodiments.

The present disclosure also includes method embodiments. Operations in an example wafer bow measurement method 1770 are shown in FIG. 17. One or more operations that are included in method 1700 are as shown and may be performed in the illustrated or other order. An output of the method 1700 may include an action 1702, including an example use case.

An example action 1702 may include process monitoring and control. As described previously, a wafer can have a positive bow, or a negative bow, or include a saddle shape. In a feed-forward process, pre-processed wafer bow values (bow measurements) feed forward to a process module to control incoming wafer bow variation. In a feed-back process, pre-processed wafer bow values and post measurement delta can be used in operations including process module quality analysis, excursion detection, compensation for process module drift over time, chamber accumulation, and other operations. In the event a process wafer target value or specification is not achieved in a given processing phase, the wafer can be rerouted back to the process module to receive an adjusted bow compensation to achieve the desired target or specification. Further bow measurements at a process step can be feed forward for process control in subsequent process step.

Other actions 1702 may include wafer stress measurement. In making a wafer stress assessment, apart from known parameters (for example Young's modulus, Poisson's ratio, and so forth), three parameters are typically needed: a wafer thickness, a wafer film thickness, and a radius of curvature or bow. Wafer thickness can be measured in any of the following ways. For example, taking relative measurements at an aligner pin location before a wafer is placed and after wafer is placed, with the height delta between the two locations indicating a wafer thickness. Another example includes taking relative measurements between two distance sensors mounted at the same location with one sensor being above the wafer and other sensor being below the wafer. Or a near infrared spectral interference based sensor can be used for wafer thickness measurement.

In making a film stress assessment, wafer bow and thickness measurements taken by a measurement unit 200 (for example as part of an integrated wafer measurement system 500) may be combined with optical thickness metrology, or a mass metrology where mass is converted to thickness based on film properties. Some examples may include an integrated measurement system 500 in which a separate optical thickness metrology sensor is mounted at a location on the frontside and/or underside of a measured wafer and utilizes one or more motion control axes for a film thickness measurement.

For valid wafer temperature compensation, an accurate wafer temperature measurement is typically needed. In this regard, non-contact based optical sensors generally require a film and substrate emissivity calibration to measure wafer temperature accurately. For example, a silicon wafer is transparent in IR, and emissivity values change based on film thickness. Alternatively, wafer temperature can be measured using contact-based probes embedded in aligner pins. An advantage of this arrangement is the provision of accurate wafer temperature measurement without additional particles. Wafer temperature may also be measured using a combination of contact-based probes embedded in aligner pins and noncontact-based temperature sensors (such as IR camera, for example), where the noncontact-based sensors can be calibrated (for example, an emissivity calibration) in real time based on measurements taken by the contact-based probes. Based on the calibrated points, a wafer-temperature non-uniformity map can be generated across the whole wafer. Some examples include a thermal stabilization station. A thermal stabilization station can be added to a measurement unit 200 or system 500 which allows a process or reference wafer to be thermally stabilized before measurement.

Figure 19:
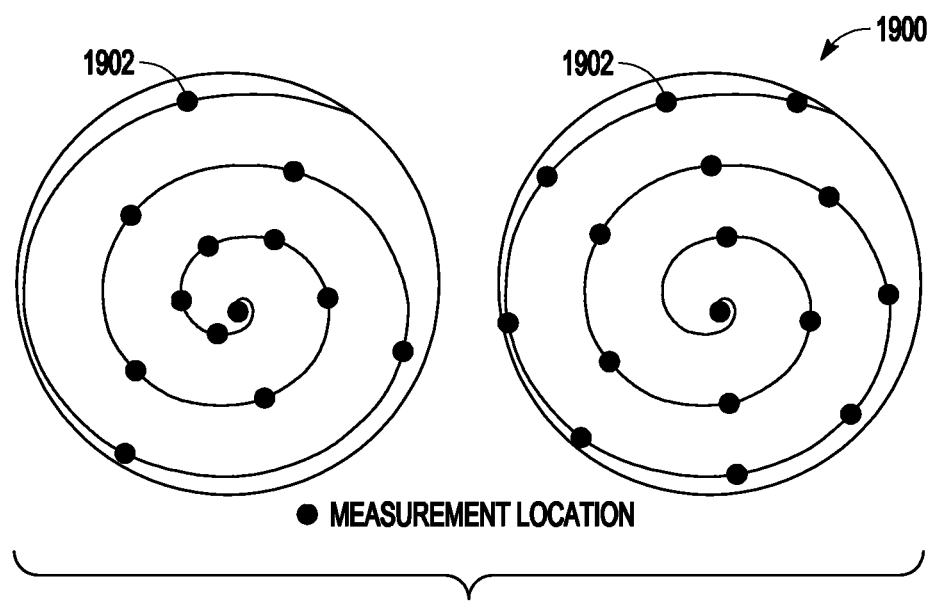
FIG. 19 shows aspects of example operations in a sampling method, according to example embodiments.

With reference to FIG. 19, example operations in a sampling method 1900 are shown in schematic outline. The example operations may be included or used in conjunction with wafer bow, wafer measurement, or wafer alignment methods described herein. The number and position of measurement locations 1902 can be optimized by synchronizing rotational, linear stage speed, sensor trigger rate during a wafer scan. The measurement locations 1902 can be adjusted by distance between points, by the number of points in a defined area, or to suit a custom combination to minimize measurement error, for example. An example spiral scan depicted on the left shows a variable distance between measurement locations 1902. An example spiral scan on the right shows a blend of combinations, including in some instances an equal distance between measurement locations 1902.

Figure 20:
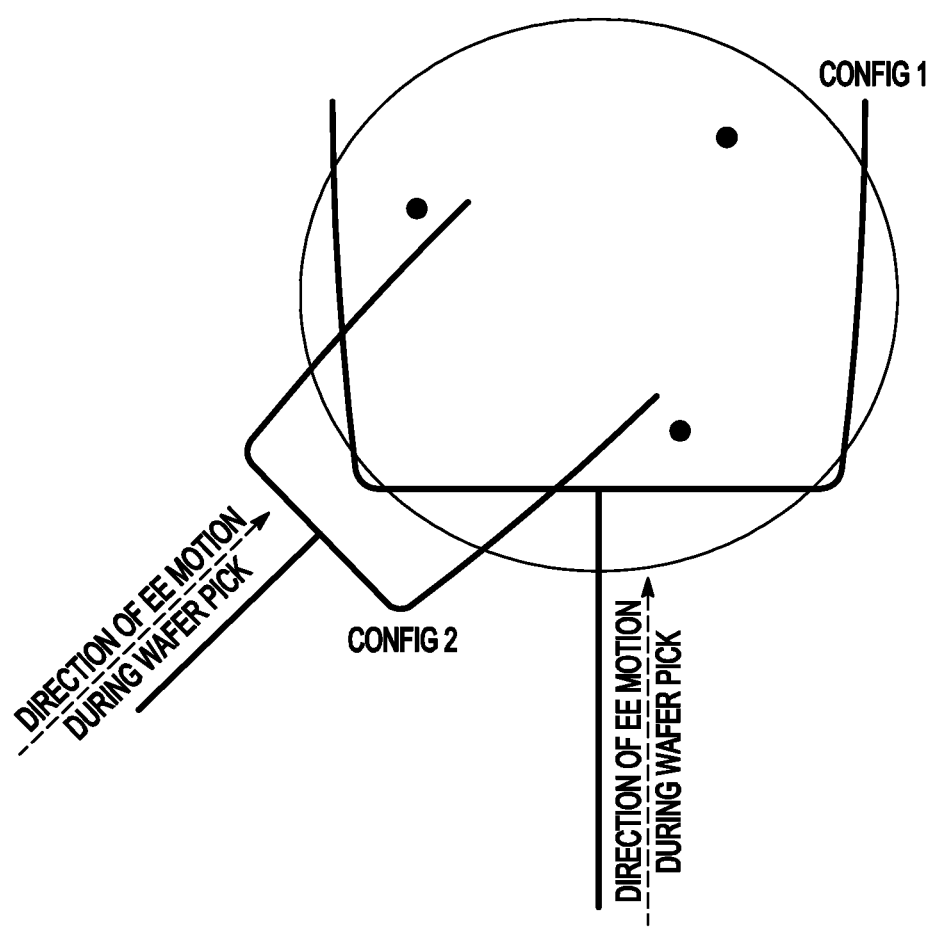
FIG. 20 shows an arrangement or configuration for a wafer bow measurement system, according to an example embodiment.

With reference to FIG. 20, an arrangement or configuration 2000 for a wafer bow measurement system is shown. Wafer bow measurement occurs in parallel to a robot move to minimize the impact on wafer throughput at a wafer processing module. In configuration 1, a robot end effector (EE) inner diameter (ID) can be made larger than an aligner pin outer diameter (OD). Configuration 2 includes an optimized move between the aligner pin and the robot with using an existing EE wherein, during pick up, a wafer is oriented such that there is no obstruction between the aligner pin and the robot EE.

In an example measurement mode, a robot pick-up time is >3 sec and a wafer bow measurement time is <2 sec i.e. of shorter duration, thereby minimising throughput, or at least not impacting time-wise or interfering with the wafer pick-up. With a synchronized movement, wafer bow measurement can be completed while robot is motion and before the robot picks up the wafer.

In some examples, additional benefits may be provided. For example, cost-wise, an aligner wafer lift is no longer needed. A wafer can be placed, picked-up, and lifted down with the same robot. From a throughput perspective, bow measurement is performed in parallel with the robot move i.e. during the time that the robot is moving to pick up a wafer. A reduced wafer pick-up and place time can also be provided as the action (including lift up/down) is completed by same robot.

Some examples of wafer bow measurements systems thus provide real-time accurate wafer bow measurement independent of wafer and ambient state. Some example systems or methods can also be used for or integrated within wafer thickness measurement systems, wafer alignment systems, and wafer stress. Example systems can serve both as a wafer aligner as well as in water bow measurement system. Actively compensating for wafer temperature, ambient temperature and humidity (among other factors) can result in an improved and more reliable metrology performance. Bow measurements can be used for process monitoring and control (feedforward or feedback) of a deposition tool. The wafer bow measurement described herein can be combined with film thickness/mass metrology, and film stress can be measured.

Although an embodiment has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

The invention claimed is:

1. A wafer bow measurement system comprising:
   a measurement unit including:
   a wafer support assembly to impart rotational movement to a measured wafer supported in the measurement unit;
   an optical sensor;
   a calibration standard to calibrate the optical sensor;
   a linear stage actuator to impart linear direction of movement to the optical sensor;
   a wafer centering sensor to determine a centering of the measured wafer supported in the measurement unit; and
   a wafer alignment sensor to determine an alignment of the measured wafer supported in the measurement unit.

2. The wafer bow measurement system of claim 1, wherein the water centering sensor includes an actuator for active centering of the measured wafer supported in the measurement unit.

3. The wafer bow measurement system of claim 1, wherein the wafer support assembly includes a wafer alignment chuck.

4. The wafer bow measurement system of claim 1, further comprising a reference wafer unit.

5. The wafer bow measurement system of claim 4, wherein the reference wafer unit includes a plurality of slots to accommodate a series of different reference wafers.

6. The wafer bow measurement system of claim 5, wherein the series of different reference wafers provide a range of measurement control references for the measured wafer supported in the measurement unit.

7. The wafer bow measurement system of claim 5, wherein the wafer bow measurement system further comprises a temperature sensor or a humidity sensor, and wherein a selection of a reference wafer in the series of different reference wafers is based on data derived from the temperature sensor or the humidity sensor.

8. The wafer bow measurement system of claim 4, further comprising a plurality of measurement units and at least one reference wafer unit.

9. The wafer bow measurement system of claim 1, wherein the water bow measurement system is integrated with a wafer processing tool.

10. The wafer bow measurement system of claim 1, wherein the calibration standard includes at least one pre-measured feature or facet scannable by the optical sensor to detect a stray in wafer bow measurement over time.

11. The wafer bow measurement system of claim 10, wherein the scannable feature or facet includes a wedge shaped silver coated diffused optical flat to serve as a proxy for a wafer thickness.

12. The wafer bow measurement system of claim 1, wherein the calibration standard includes multiple steps scannable by the optical sensor to detect a stray in wafer bow measurement over time.

13. The wafer bow measurement system of claim 1, further comprising a vibration isolation mechanism or mount.

14. A method of measuring a water bow of a wafer in a wafer processing stream that includes a wafer processing module, the method comprising:
  integrating a wafer bow measurement system with the wafer processing module, the wafer measurement system comprising:
    a wafer support assembly to impart rotational movement to a measured wafer supported in the measurement unit;
    an optical sensor;
    a calibration standard to calibrate the optical sensor;
    a linear stage actuator to impart linear direction of movement to the optical sensor;
    a wafer centering sensor to determine a centering of the measured wafer supported in the measurement unit; and
    a wafer alignment sensor to determine an alignment of the measured wafer supported in the measurement unit;
  extracting a wafer from the wafer processing stream for wafer bow measurement by the wafer bow measurement system;
  adjusting a parameter of the wafer processing stream based on a water bow measurement derived by the wafer bow measurement system; and
  placing the measured wafer back into the wafer processing stream.

* * * * *